United States Patent [19]

Nakagawa

[11] Patent Number: 5,107,071
[45] Date of Patent: Apr. 21, 1992

[54] SEALING AND SHIELDING STRUCTURE

[75] Inventor: Asaharu Nakagawa, Yokkaichi, Japan

[73] Assignee: Kitagawa Industries Co., Ltd., Nagoya, Japan

[21] Appl. No.: 583,725

[22] Filed: Sep. 14, 1990

[30] Foreign Application Priority Data

Sep. 18, 1989 [JP] Japan .................. 1-241559

[51] Int. Cl.[5] .................. H05K 9/00; B65D 53/00
[52] U.S. Cl. .................. 174/35 GC; 174/35 R; 277/227; 277/235 R; 277/901
[58] Field of Search .......... 174/35 R, 35 MS, 35 GC; 219/10.55 D, 10.55 R; 361/424; 277/227, 228, 235 R, 234, 901; 220/681

[56] References Cited

U.S. PATENT DOCUMENTS

| | | | |
|---|---|---|---|
| 3,019,281 | 1/1962 | Hartwell | 174/35 GC |
| 4,188,037 | 2/1980 | Abbes et al. | 277/2 |
| 4,710,590 | 12/1987 | Ekdahl | 174/35 GC |
| 4,720,606 | 1/1988 | Senn . | |

FOREIGN PATENT DOCUMENTS 0207005 12/1986 European Pat. Off. .
2098808 11/1982 United Kingdom .
2174551 11/1986 United Kingdom .

Primary Examiner—Leo P. Picard
Assistant Examiner—Bot Lee Ledynh
Attorney, Agent, or Firm—Tarolli, Sundheim & Covell

[57] ABSTRACT

A sealing and shielding structure of the present invention comprises an elastic sealing member and an electromagnetic shideling member provided in a cavity formed at least in one of a first member and a second member both of which have conductive abutting faces. The elastic sealing member is, for example, slightly larger than the electromagnetic shielding member so as to be pressed between the first and the second members. Accordingly, when the first and the second members are closed, the elastic sealing member is compressed and deformed to push the electromagnetic shielding member so that the electromagnetic shielding member closely contacts with the conductive abutting faces of the first and the second members. Consequently, the sealing and shielding structure can produce a prominent electromagnetic wave shielding effect because of the electromagnetic shielding member kept in close contact with the conductive abutting faces of the first and the second members.

29 Claims, 1 Drawing Sheet

SEALING AND SHIELDING STRUCTURE

BACKGROUND OF THE INVENTION

This invention relates to a sealing and shielding structure for sealing gaps, for example, between a housing for an electronic apparatus, etc. and a lid thereof, and for shielding the electronic apparatus, etc. from electromagnetic waves.

Conventionally, sealants made of various resins, for example, a synthetic rubber O-ring provided with elasticity by rubber and a synthetic resin packing formed to fit some gaps, are known. These sealants, closely mounted in gaps, prevent anything from leaking out of housings and also prevent outside airborne particles and water vapor from entering the housing.

However, when these sealants are attached to housings for electronic apparatus, electromagnetic wave noise may invade the electronic apparatus or leak from the electronic apparatus, because these sealants made of elastic rubber are, in general, not provided with conductivity. The electromagnetic wave noise may be transmitted on signal conductors of the electronic apparatus and adversely affect other neighboring apparatus. Accordingly, a conductive sealant which can shield electromagnetic wave noise is desirable.

One known conductive sealant is made of elastic material containing conductive metallic particles or carbon black particles as a conductive filler and can shield electromagnetic wave noise. However, such a conductive sealant has a problem: when conductive metallic particles, etc. are added to the elastic material in large amounts to increase the shielding effect, the conductive sealant becomes hard and brittle and cannot sufficiently function as a sealant.

SUMMARY OF THE INVENTION

An object of the present invention is to provide a sealing and shielding structure which can produce both an effective sealing effect and an effective shielding effect against electromagnetic wave noise.

This object is achieved by this invention, which provides a sealing and shielding structure comprising an elastic sealing member and an electromagnetic shielding member, both of which are placed between conductive abutting faces of a first member and a second member facing each other. The elastic sealing member is accommodated together with the electromagnetic shielding member in a cavity formed at least in one of the first member and the second member. When the first member and the second member are closely abutted with each other, the elastic sealing member is pressed in the cavity and deformed to push the electromagnetic shielding member. The electromagnetic shielding member thus closely contact with the conductive abutting faces of the first member and the second member.

DESCRIPTION OF THE PREFERRED EMBODIMENTS

Set forth is a description of the preferred embodiments of the present invention with reference to the attached drawings.

Figure 1:
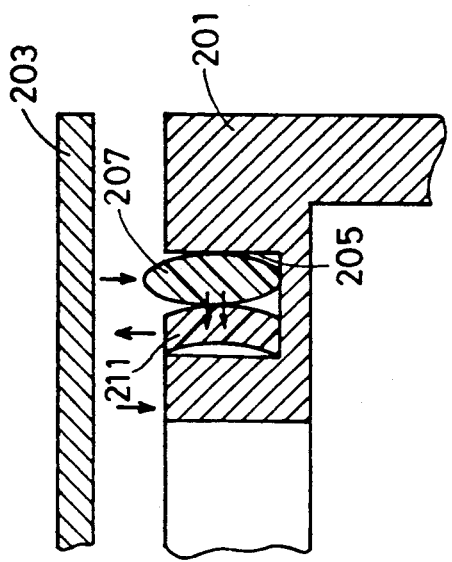
FIG. 1 is a cross-sectional view of a sealing and shielding structure for the first embodiment of the present invention.

In FIG. 1, which shows a sealing and shielding structure of the first embodiment, numerals 1 and 3 denote a housing for an electronic apparatus. The housing includes a main section or first section 1 and a lid or second section 2 which face each other when the housing is closed. The housing 1 and the lid 3 are made of electrically conductive material at least at their abutting-faces. A groove 5 is formed in whole peripheral edges of an opening of the housing 1. In the groove 5 an elastic sealing member 7 with an L-shaped cross section is placed and an electromagnetic shielding member 11 with a quadrangular cross section is mounted on a step 9 of the elastic sealing member 7.

The elastic sealing member 7 is mainly composed of resin or rubber so as to be provided with appropriate elasticity. Magnetic material is added if needed, and popular fillers, plasticizers, degradation inhibitors, etc. may also be blended therein. The resin used may be chosen from the group of polyurethane resin, silicone resin, vinyl chloride resin, etc. The rubber may be chosen from the group of chloroprene rubber, natural rubber, etc.

On the other hand, high conductivity is more important than elasticity in making the electromagnetic shielding member 11. The electromagnetic shielding member 11 is a electrically conductive elastomer made of polymeric materials, such as synthetic resin, copolymer of the synthetic resin, and rubber. The synthetic resin includes polyolefine resin, polyamide resin, polyester resin, polyurethane resin, polyorganosiloxane resin, polystyrene resin, silicone resin, epoxy resin, and vinyl chloride resin. The rubber includes chloroprene rubber and natural rubber. A conductivity agent is added to the electromagnetic shielding member 11. The conductivity addition agent includes metal powder, carbon black, carbon fiber, etc. The carbon fiber is manufactured through a vapor phase system where hyperfine particles of a compound of a high-melting metal are floated in a pyrolysis zone of hydrocarbon. Alternatively, the electromagnetic shielding member 11 may be moulded from a wire mesh in a predetermined shaped by a die, or a knitted wire may cover the electromagnetic shielding member 11. The electromagnetic shielding member 11 and the elastic shielding member 7 may be adhered to each other.

The sealing and shielding structure with the aforementioned construction functions as follows.

When the lid 3 closes the opening of the housing 1 the underside of the lid 3 presses the elastic sealing member 7. The elastic sealing member 7 is deformed to push the electromagnetic shielding member 11, which expands in the groove 5 surrounded by the lid 3 and the housing 1. Thus the electromagnetic shielding member 11 keeps in close contact with the housing 1 and the lid 3.

Accordingly, an effective seal can be obtained because of the elastic sealing member 7 between the housing 1 and the lid 3. The electromagnetic shielding member 11 with high conductivity interposed between the conductive abutting faces of the housing 1 and the lid 3 conducts electricity between the housing 1 and the lid 3. Therefore, the electronic apparatus contained in the housing 1 is protected from outside electromagnetic wave noise and electromagnetic wave generated in the electronic apparatus are prevented from leaking out of the housing 1. Further, the above effects can be attained simply by closing the housing 1 with the lid 3.

Figure 2:
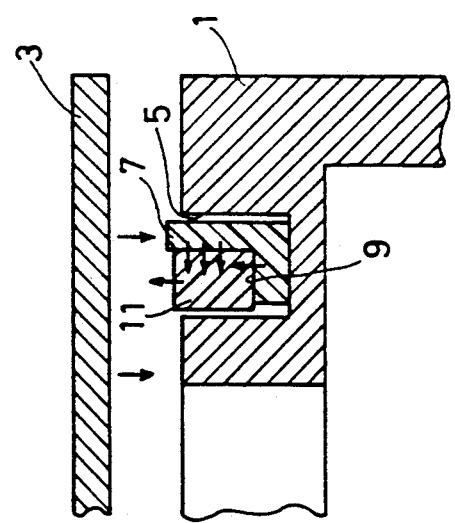
FIG. 2 is a cross-sectional view of a sealing and shielding structure for the second embodiment of the present invention.
Figure 3:
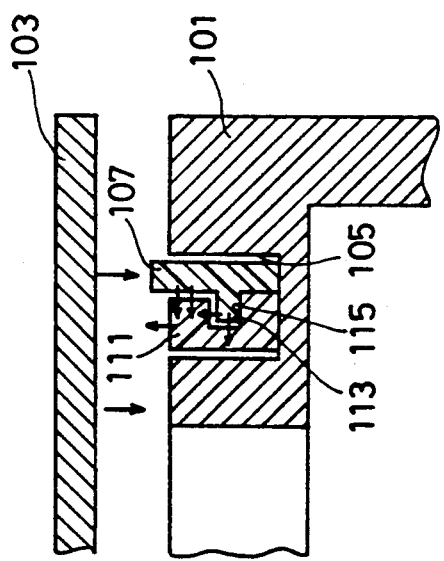
FIG. 3 is a cross-sectional view of a sealing and shielding structure for the third embodiment of the present invention.

Other preferable elastic sealing members 107 and 207 and electromagnetic shielding members 111 and 211 are shown in FIGS. 2 and 3, respectively. Since the elastic members 107 and 207 are designed to press the electromagnetic shielding members 111 and 211, the electromagnetic shielding members 111 and 211 are deformed in the grooves 105 and 205 when lids 103 and 203 close housings 101 and 201, respectively.

As shown in FIG. 2, which shows a sealing and shielding structure of the second embodiment, the elastic sealing member 107 is provided with a protrusion 113 at the middle portion of the inner side facing the electromagnetic shielding member 111. The electromagnetic shielding member 111 is provided with an annular notch 115 with which the protrusion 113 of the elastic sealing member 107 engages. During engagement of the elastic sealing member 107 and the electromagnetic shielding member 111, these members 107 and 111 are tightly pressed against each other and placed at appropriate positions.

FIG. 3 shows a sealing and shielding structure of the third embodiment. The elastic sealing member 207 has an elliptical cross section, and the electromagnetic shielding member 211 is formed to be circular arc in cross section. When the lid 203 closes the housing 201, the elastic sealing member 207 presses the electromagnetic shielding member 211 so that an end of the electromagnetic shielding member 211 moves upward. Therefore, the housing 201 and the lid 203 are sealed by the elastic sealing member 207 and are electrically conducted by the elastic sealing member 207.

In the embodiments described above, the elastic sealing member 7, 107, and 207 are taller than the depth of the grooves 5, 105, and 205 such that the elastic sealing member 7, 107, and 207 are deformed when pushed by the lids 3, 103, and 203. However, the same effect can be expected by a lid provided with a projection or the like for pushing an elastic sealing member.

As described above, the sealing and shielding structures of the present invention can produce both effective sealing effect and effective electromagnetic wave shielding effect. When the first and the second members contact each other the elastic sealing members are compressed and deformed to press the electromagnetic shielding members. Therefore, the electromagnetic shielding members are also deformed to be kept in close contact with the conductive abutting faces of the first members and the second members.

What is claimed is:

1. A sealing apparatus for electromagnetically sealing a gap between first and second conductive surfaces, comprising:
    a conductive member; and
    an elastic sealing member formed to reside in a cavity on the first conductive surface and to allow the conductive member also to reside in the cavity; wherein
    the second conductive surface contacts and deforms the sealing member residing in the cavity such that the sealing member presses the conductive member against the first and second conductive surfaces.

2. The sealing apparatus of claim 1, in which the conductive member is comprised of conductive material impregnated in a material chosen from the group consisting of rubber, synthetic resin, and copolymer of the synthetic resin.

3. The sealing apparatus of claim 2, in which the conductive material is chosen from the group consisting of metal powder, carbon black, and carbon fiber.

4. The sealing apparatus of claim 1, in which the sealing member protrudes out of the cavity to contact the second conductive surface.

5. The sealing apparatus of claim 1, in which a conductive projection, which is formed on the second conductive surface, protrudes into the cavity to contact the sealing member.

6. The sealing apparatus of claim 1, in which:
    the conductive member is elastic; and
    when the second conductive surface deforms the sealing member, the sealing member deforms the conductive member such that a portion of the conductive member extends from the cavity to contact the second conductive member.

7. The sealing apparatus of claim 1, in which:
    a portion of the sealing member is interposed between a closed end of the cavity and the conductive member; and
    the second conductive surface also contacts the conductive member, thereby compressing the interposed portion of the sealing member.

8. The sealing apparatus of claim 1, in which the sealing member is comprised of material chosen from the group consisting essentially of natural rubber, chloroprene rubber, polyurethane resin, silicone resin, and vinyl chloride resin.

9. The sealing apparatus of claim 8, in which the sealing member is further comprised of magnetic material.

10. The sealing apparatus of claim 1, in which the conductive member is comprised of a material chosen from the group consisting essentially of knitted wire mesh and molded wire mesh.

11. The sealing apparatus of claim 1, in which the conductive member is adhered to the sealing member.

12. A sealing apparatus for electromagnetically sealing a gap between first and second conductive surfaces, comprising:
    a conductive member formed to reside in a cavity on the first conductive surface with a first end of the conductive member adjacent to a closed end of the cavity; and
    an elastic sealing member formed to reside in the cavity on the first conductive surface adjacent to the conductive member with a first end of the sealing member contacting the closed end of the cavity; wherein
    the second conductive surface contacts a second end of the sealing member and deforms the sealing member such that the sealing member presses the conductive member and forces a second end of the conductive member against the second conductive surfaces.

13. The sealing apparatus of claim 12, in which:
    the conductive member is elastic and arc-shaped in cross-section, with a bottom and a top of the arc-shaped cross-section forming the first and second ends of the conductive member, respectively;
    the sealing member is elliptical in cross-section, with a bottom and a top of the elliptical cross-section forming the first and second ends of the sealing member, respectively; and the second conductive surface compresses the sealing member such that a side of the elliptical cross-section presses against an outside surface of the arc-shaped cross-section to deform the conductive member and force the first end of the conductive member against a side of the cavity and the second end of the conductive member out of the cavity against the second conductive surface.

14. A sealing apparatus for electromagnetically sealing a gap between a conductive housing for electrical equipment and a conductive lid for closing an opening in the housing, comprising:
a conductive member formed to reside in a cavity formed on a surface of the housing around the opening in housing; and
an elastic sealing member formed to reside in the cavity adjacent to the conductive member; wherein
a contacting surface of the lid contacts and deforms the sealing member residing in the cavity such that the sealing member presses the conductive member against the contacting surface and a surface of the cavity of the housing.

15. The sealing apparatus of claim 14, in which:
the conductive member is elastic and arc-shaped in cross-section, with a bottom of the arc-shaped cross-section contacting a closed end of the cavity and a top of the arc-shaped cross-section contacting the contacting surface;
the sealing member is elliptical in cross-section, with a bottom of the elliptical cross-section contacting the closed end of the cavity and a top of the elliptical cross-section contacting the contacting surface; and
the contacting surface compresses the sealing member such that a side of the elliptical cross-section presses against an outside surface of the arc-shaped cross-section to deform the conductive member and force the first end of the conductive member against a side of the cavity and the second end of the conductive member out of the cavity against the contacting surface.

16. A sealing apparatus for electromagnetically sealing a gap between first and second conductive surfaces, comprising:
a conductive member; and
an elastic sealing member formed to reside in a cavity on the first conductive surface and to allow the conductive member also to reside in the cavity; wherein
the second conductive surface contacts and deforms the sealing member residing in the cavity such that the sealing member presses the conductive member against the first and second conductive surfaces;
a portion of the sealing member is interposed between a closed end of the cavity and the conductive member;
the second conductive surface also contacts the conductive member, thereby compressing the interposed portion of the sealing member;
the conductive member is rectangular in cross-section;
the sealing member is L-shaped in cross-section with a bottom leg of the L-shaped cross-section abutting the closed end of the cavity; and
the conductive member abuts the sealing member such that the bottom leg of the L-shaped cross-section is interposed between the conductive member and the closed end of the cavity.

17. The sealing apparatus of claim 16, in which:
a combined thickness of the bottom leg of the L-shaped cross-section of the sealing member and the conductive member is greater than the depth of the cavity; and
the length of a top leg of the L-shaped cross-section is greater than said combined thickness.

18. A sealing apparatus for electromagnetically sealing a gap between first and second conductive surfaces, comprising:
a conductive member formed to reside in a cavity on the first conductive surface with a first end of the conductive member adjacent to a closed end of the cavity; and
an elastic sealing member formed to reside in the cavity on the first conductive surface adjacent to the conductive member with a first end of the sealing member contacting the closed end of the cavity; wherein
the second conductive surface contacts a second end of the sealing member and deforms the sealing member such that the sealing member presses the conductive member and forces a second end of the conductive member against the second conductive surfaces;
the conductive member is elastic and generally U-shaped in cross-section, with the two sides of the U-shaped cross-section forming the first and second ends of the conductive member;
the sealing member is generally T-shaped in cross-section, with the two ends of the top of the T-shaped cross-section forming the first and second ends of the sealing member;
the bottom of the T-shaped cross-section engages the open end of the U-shaped cross-section; and
when the second conductive surface contacts the second end of sealing member, the sealing member deforms, and the bottom of the T-shaped cross-section deforms the conductive member to force the closed end of the U-shaped cross-section against a side of the cavity and the second end of the conductive member out of the cavity against the second conductive surface.

19. A sealing apparatus for electromagnetically sealing a gap between a conductive housing for electrical equipment and a conductive lid for closing an opening in the housing, comprising:
a conductive member formed to reside in a cavity formed on a surface of the housing around the opening in the housing; and
an elastic sealing member formed to reside in the cavity adjacent to the conductive member; wherein
a contacting surface of the lid contacts and deforms the sealing member residing in the cavity such that the sealing member presses the conductive member against the contacting surface and a surface of the cavity of the housing;
the conducting member is elastic and rectangular in cross-section;
the sealing member is L-shaped in cross-section, with a bottom leg of the L-shaped cross-section abutting a closed end of the cavity;
the conductive member abuts the sealing member such that the bottom leg of the L-shaped cross-section is interposed between the conductive member and the closed end of the cavity;

a combined thickness of the bottom leg of the L-shaped cross-section of the sealing member and the conductive member is greater than the depth of the cavity; and the length of a top leg of the L-shaped cross-section is greater than said combined thickness.

20. A sealing apparatus for electromagnetically sealing a gap between a conductive housing for electrical equipment and a conductive lid for closing an opening in the housing, comprising:

a conductive member formed to reside in a cavity formed on a surface of the housing around the opening in the housing; and an elastic sealing member formed to reside in the cavity adjacent to the conductive member; wherein a contacting surface of the lid contacts and deforms the sealing member residing in the cavity such that the sealing member presses the conductive member against the contacting surface and a surface of the cavity of the housing;

the conductive member is elastic and generally U-shaped in cross-section, with first and second sides of the U-shaped cross-section contacting a closed end of the cavity and the contacting surface, respectively;

the sealing member is generally T-shaped in cross-section, with the first and second ends of the top of the T-shaped cross-section contacting the closed end of the cavity and the contacting surface, respectively;

the bottom of the T-shaped cross-section engages the open end of the U-shaped cross-section; and when the contacting surface contacts the second side of the T-shaped cross-section, the sealing member deforms, and the bottom of the T-shaped cross-section deforms the conductive member to force the closed end of the U-shaped cross-section against a side of the cavity and second side of the U-shaped cross-section out of the cavity against the contacting surface.

21. An apparatus for providing an electromagnetic shield and a seal in a gap between a first surface of a first section of an electrically conductive housing for electrical equipment and a second surface of a second section of the housing, the first surface in part defining a cavity for reception of said apparatus, the first surface and the second surface being relatively displaceable, said apparatus comprising:

an electrically conductive member for providing an electromagnetic energy shield, said conductive member including a first portion which engages the first surface, said conductive member including a second portion which protrudes from the cavity, said second portion of said conductive member being engagable with the second surface upon relative displacement of the first and second surfaces; and an elastic member for providing a seal between the first and second surfaces, said elastic member having a first portion which protrudes from the cavity, said first portion of said elastic member being engagable with and deformable by the second surface upon relative displacement of the first and second surfaces, said elastic member having a second portion extending from said first portion, said second portion extending to engage said conductive member.

22. An apparatus as set forth in claim 21, wherein a surface of said conductive member defines a recess, said second portion of said elastic member extending into said recess.

23. An apparatus as set forth in claim 22, wherein said first portion of said elastic member engages a closed end of the cavity.

24. An apparatus of set forth in claim 21, wherein said conductive member is rectangular in cross-section, said elastic member extending to engage a closed end of the cavity.

25. An apparatus for providing an electromagnetic shield and a seal between a first section of an electrically conductive housing for electrical equipment and a second section of the housing, the first section of the housing having a surface which at least partially defines a cavity for reception of said apparatus, said apparatus comprising:

a first member for providing an electromagnetic shield between the first and second sections of the housing; and a second member for providing a seal between the first and second sections of the housing and for displacing at least a portion of said first member toward the second portion of the housing upon movement of the second portion of the housing toward, and to a position adjacent to, the first portion of the housing.

26. An apparatus as set forth in claim 25, wherein said first member including a conductive member, said conductive member including a surface for engagement with the second section of the housing, said second member including an elastic member, said elastic member including a first portion for protrusion from the cavity, said first portion of said elastic member including a surface for engagement with the second section of the housing, said elastic member including a second portion for applying force to said conductive member.

27. An apparatus as set forth in claim 26, wherein said conductive member is rectangular in cross-section, said elastic member is L-shaped in cross-section, said elastic member having a bottom leg of the L-shape which abuts the closed end of the cavity, said bottom leg of the L-shape being disposed between the closed end of the cavity and said conductive member, said bottom leg of the L-shape at least partially defining the second portion of said conductive member.

28. An apparatus as set forth in claim 26, wherein a surface of said conductive member at least partially defines a recess, said second portion of said elastic member extending into said recess, said conductive member being deformed by said second portion of said elastic member.

29. An apparatus as set forth in claim 26, wherein said conductive members is arc-shaped in cross-section, said elastic member is elliptical in cross-section, said conductive member having a first surface which is concave and a second surface which is convex, said concave surface faces away from said elastic member and said convex surface faces toward said elastic member, said conductive member being deformed by said elastic member.

* * * * *

UNITED STATES PATENT AND TRADEMARK OFFICE
CERTIFICATE OF CORRECTION

PATENT NO. : 5,107,071
DATED      : April 21, 1992
INVENTOR(S): Asaharu Nakagawa It is certified that error appears in the above-identified patent and that said Letters Patent is hereby corrected as shown below:

Column 8, Line 12, Claim 24, change "of" to --as--.

Signed and Sealed this

Tenth Day of August, 1993

Attest:

MICHAEL K. KIRK

Attesting Officer

Acting Commissioner of Patents and Trademarks